United States Patent
Lee et al.

(10) Patent No.: US 7,084,073 B2
(45) Date of Patent: Aug. 1, 2006

(54) METHOD OF FORMING A VIA HOLE THROUGH A GLASS WAFER

(75) Inventors: Moon-chul Lee, Sungnam (KR); Hyung Choi, Sungnam (KR); Kyu-dong Jung, Suwon (KR); Mi Jang, Suwon (KR); Seog-woo Hong, Busan (KR); Seok-whan Chung, Suwon (KR); Chan-bong Jun, Seoul (KR); Seok-jin Kang, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 222 days.

(21) Appl. No.: 10/681,217

(22) Filed: Oct. 9, 2003

(65) Prior Publication Data

US 2004/0092105 A1    May 13, 2004

(30) Foreign Application Priority Data

Nov. 12, 2002   (KR) .................. 10-2002-0070121

(51) Int. Cl.
*H01L 21/302* (2006.01)

(52) U.S. Cl. .................. 438/745; 438/753; 438/756

(58) Field of Classification Search ............ 438/719, 438/723, 745, 753, 756, 757
See application file for complete search history.

(56) References Cited

U.S. PATENT DOCUMENTS

| | | | |
|---|---|---|---|
| 6,338,284 B1 * | 1/2002 | Najafi et al. | 73/866.1 |
| 6,380,095 B1 * | 4/2002 | Liu et al. | 438/719 |
| 6,471,883 B1 * | 10/2002 | Fell et al. | 216/77 |
| 6,576,150 B1 * | 6/2003 | Weigert | 216/24 |
| 6,618,200 B1 * | 9/2003 | Shimizu et al. | 359/619 |
| 6,690,032 B1 * | 2/2004 | Umetsu | 257/72 |
| 6,852,560 B1 * | 2/2005 | Corso | 438/48 |
| 2004/0152229 A1 * | 8/2004 | Najafi et al. | 438/52 |

FOREIGN PATENT DOCUMENTS

JP    2001-341214    12/2001

OTHER PUBLICATIONS

Belloy, et al, "Micromachining of Glass Inertial Sensors", J. Microelectromechanical Systems, 11(1):85-90 (Feb 2002).
Diepold et al, "Smoothing of Ultrasonically Drilled Holes in Borosilicate Glass by Wet Chemical Etching", J. Micromechanics and Microengineering, 6(1):29-32 (Mar. 1996).

(Continued)

*Primary Examiner*—Kin-Chan Chen
(74) *Attorney, Agent, or Firm*—Lee & Morse, P.C.

(57) ABSTRACT

A method of forming a via hole through a glass wafer includes depositing a material layer on an outer surface of the glass wafer, the material layer having a selection ratio higher than that of the glass wafer, forming a via-patterned portion on one side of the material layer, performing a first etching in which the via-patterned portion is etched to form a preliminary via hole, eliminating any remaining patterning material used in the formation of the via-patterned portion, performing a second etching in which the preliminary via hole is etched to form a via hole having a smooth surface and extending through the glass wafer, and eliminating the material layer. The method according to the present invention is able to form a via hole through a glass wafer without allowing formation of an undercut or minute cracks, thereby increasing the yield and reliability of MEMS elements.

10 Claims, 5 Drawing Sheets

OTHER PUBLICATIONS

Gretillat et al, "A New Fabrication Method for Borosilicate Glass Capillary Tubes With Lateral Inlets and Outlets", Sensors & Actuators A, 60(1-3):219-222 (May 1997).

Oberhammer et al, "Incremenally Etched Electrical Feedthroughs for Wafer-Level Transfer of Glass Lid Packages", Transducers, Solid-State Sensors, Actuators and Microsystems, 12th International Conference, vol. 2, pp. 1832-1835, (Jun. 2003).

Schlautmann et al, "Powder-Blasting Technology as an Alternative Tool for Microfabrication of Capillary Electrophoresis Chips with Integrated Conductivity Sensors", J. Micromechanics and Microengineering, 11(4):386-389, (Oct. 2001).

Wensink et al. "Fine Tuning the Roughness of Powder Blasted Surfaces", J. Micromechanics and Microengineering, 12(5):616-620 (Sep. 2002).

* cited by examiner

METHOD OF FORMING A VIA HOLE THROUGH A GLASS WAFER

BACKGROUND OF THE INVENTION

1. Field of the Invention

The present invention relates to a method of forming a via hole through a glass wafer. More particularly, the present invention relates to a method of forming a via hole through a glass wafer without producing an undercut.

2. Description of the Related Art

It is generally known in the art that a via hole (or simply a "via") necessarily should be formed in a wafer level of a micro-electromechanical system (MEMS) packaging utilizing glass to permit the electrical processing of elements in the MEMS. In a conventional method of forming a via hole in a wafer level, however, since the via hole is formed by sandblasting after being patterned on a surface of the glass wafer, it is problematic in that the formed via hole may have an undercut portion and a rough surface. This undercut problem is especially pronounced in the formation of a via hole having a small diameter. In this case, not only is it difficult to etch the via hole, but the formed via hole may also have an undercut portion that causes a severe problem.

FIG. 1 illustrates a sectional view of a via hole formed through a glass wafer 100 using a conventional process, in which the via hole has an undercut portion 10 formed at a lower end thereof and a rough surface 20. FIGS. 2A and 2B are photographs showing enlarged views of a via hole, which is formed in an actual glass wafer using a conventional process, and an undercut portion formed at a lower end of the via hole, respectively.

In order to reduce formation of the undercut portion at the lower end of a via hole as described above, conventional methods of forming a via hole have employed a chemical mechanical polishing (CMP) step or a thick deposition of a metal film that enables electrical connection. In the case of the method employing the CMP step, however, since a portion of the glass surface is completely eliminated, characteristics of elements may be damaged in a packaging in which the delicate glass surface plays an important role. Further, the method employing the deposition of a metal film requires increased manufacturing steps and manufacturing cost.

Moreover, when the via hole is formed by sandblasting, the via hole may not only have a rough surface, but may also have minute cracks formed therein.

SUMMARY OF THE INVENTION

Accordingly, the present invention has been made in an effort to solve at least some of the above-mentioned problems occurring in the prior art. A feature of the present invention is to provide a method of forming a via hole through a glass wafer in an MEMS packaging that is capable of preventing formation of an undercut and minute cracks at the via hole and enables the via hole to have a smooth surface.

To provide this feature, an embodiment of the present invention provides a method of forming a via hole through a glass wafer including depositing a material layer on an outer surface of the glass wafer, the material layer having a selection ratio higher than that of the glass wafer, forming a via-patterned portion on one side of the material layer, performing a first etching in which the via-patterned portion is etched to form a preliminary via hole, eliminating any remaining patterning material used in the formation of the via-patterned portion, performing a second etching in which the preliminary via hole is etched to form a via hole having a smooth surface and extending through the glass wafer, and eliminating the material layer.

Preferably, the material layer is formed of polysilicon.

The first etching may be performed by an ultrasonic wave, a drill, or a laser beam. Preferably, the first etching is performed by sandblasting. Also preferably, during the first etching, the via-patterned portion is etched to a sufficient depth so that the preliminary via hole has a bottom adjacent to another side of the material layer opposite to the via-patterned portion.

The formation of the via-patterned portion may include laminating a film resistor on an upper surface of the material layer, and exposing and developing the film resistor to form the via-patterned portion on one side of the material layer. Preferably, the film resistor comprises a material having a large resistance to sandblast etching to permit the film resistor to function as a protection film during subsequent sandblasting of the glass wafer.

Preferably, the second etching is a wet etching. More preferably, the wet etching uses a hydrofluoric acid (HF) solution.

In the method of forming a via hole through a glass wafer according to the embodiment of the present invention as described above, a rough preliminary via hole is formed by a first etching and is then subjected to a second etching, so that a via hole is formed without an undercut or minute cracks.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
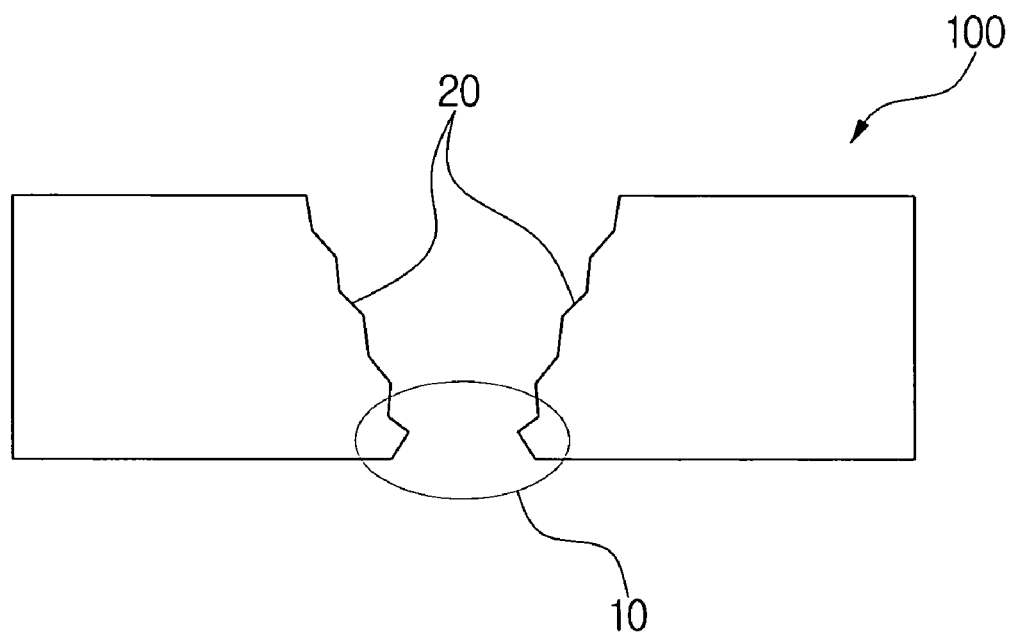
FIG. 1 illustrates a sectional view of a via hole formed through a glass wafer using a conventional process.

Korean Patent Application No. 2002-70121, filed on Nov. 12, 2002, and entitled: "Method of Forming a Via Hole Through a Glass Wafer," is incorporated by reference herein in its entirety.

The present invention will now be described more fully hereinafter with reference to the accompanying drawings, in which a preferred embodiment of the invention is shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIGS. 3A to 3E illustrate sectional views of sequential stages in a method of forming a via hole through a glass wafer according to a preferred embodiment of the present invention.

Figure 3A:
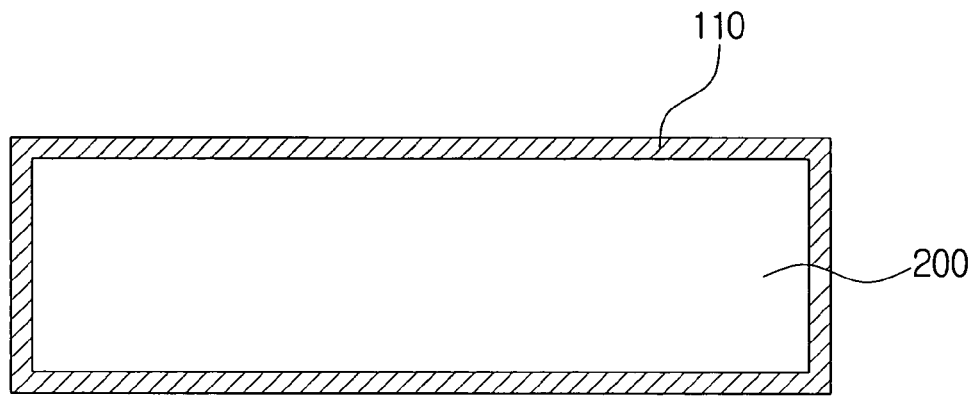
FIGS. 3A to 3E illustrate sectional views of sequential stages in a method of forming a via hole through a glass wafer according to a preferred embodiment of the present invention.

Referring to FIG. 3A, a material layer 110 is deposited on an outer surface of a glass wafer 200. The material layer has a selection ratio higher than that of the glass wafer 200. Preferably, the material layer is formed of polysilicon.

Figure 3B:
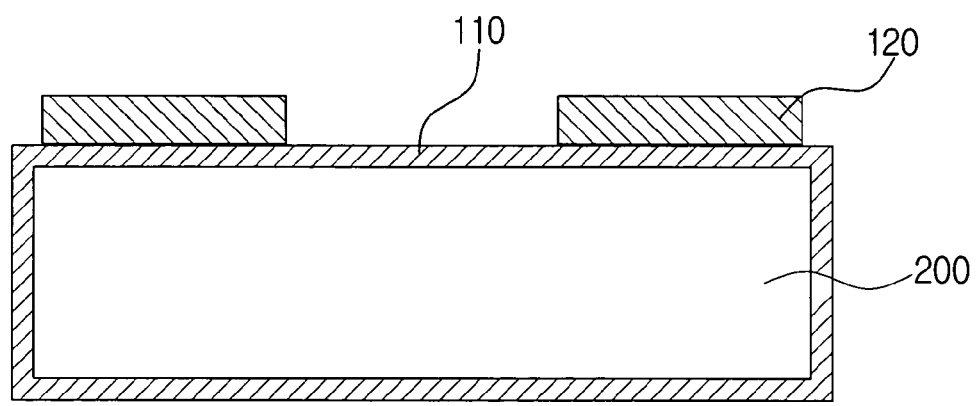

Referring to FIG. 3B, a film resistor 120 is laminated on an upper surface of the polysilicon layer 110 deposited on the glass wafer 200, and a via-patterned portion is formed thereon by exposure and development. The film resistor 120 is a material having a large resistance to sandblast etching, thus functioning as a protection film against subsequent sandblasting of the glass wafer 200. In an embodiment of the present invention, the formation of the via-patterned portion on the polysilicon layer 110 does not necessarily require the film resistor 120. The via-patterned portion may be formed using various photosensitive means.

Figure 3C:
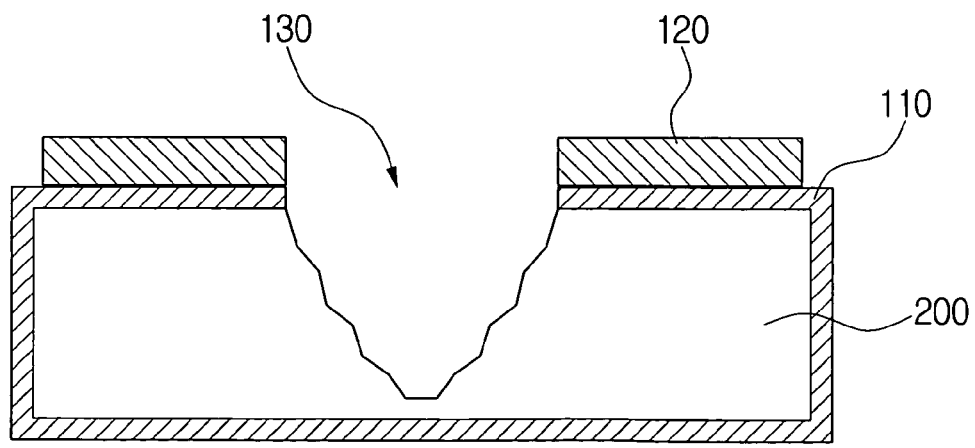

Referring to FIG. 3C, the via-patterned portion is thereafter subjected to a first etching to form a preliminary via hole 130. During the first etching, the preliminary via hole 130 is etched to a sufficient depth so that the preliminary via hole 130 has a bottom adjacent to another side of the polysilicon layer opposite to the via-patterned portion. More specifically, the preliminary via hole 130 is formed to have a bottom adjacent to the polysilicon layer 110 formed on a lower surface of the glass wafer 200. Although the first etching is preferably performed by sandblasting, the first etching may be performed by various etching methods. For example, the first etching may alternately be performed by an ultrasonic wave, a drill, or a laser beam.

Figure 3D:
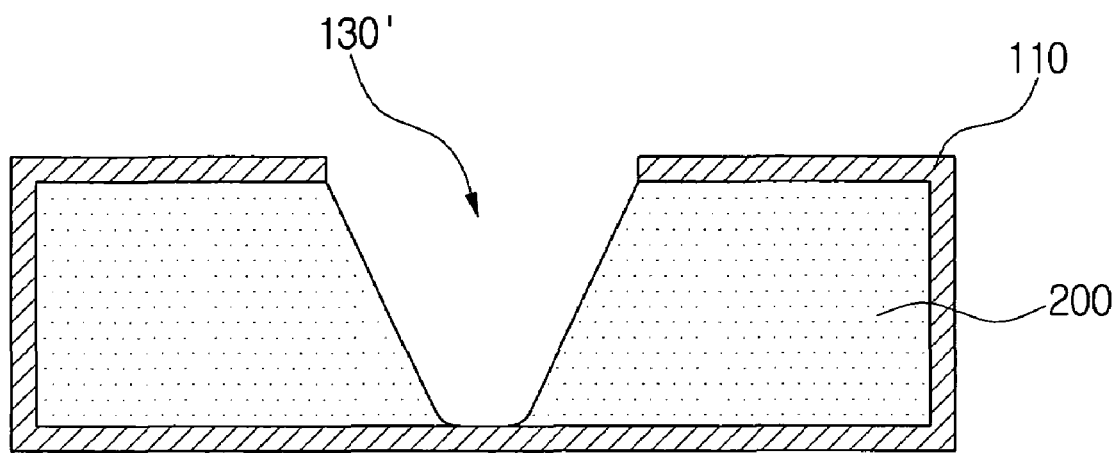

Referring now to FIG. 3D, subsequently, the film resistor 120 is eliminated, and the preliminary via hole 130 is etched a second time so that a via hole 130' having a smooth surface and extending completely to the polysilicon layer 110 through the glass wafer 200 is formed. Preferably, the second etching is a wet etching. The second etching, which is a wet etching, may employ various etching solutions capable of making a chemical reaction with the glass wafer. Preferably, the wet etching uses a hydrofluoric acid (HF) solution.

Figure 3E:
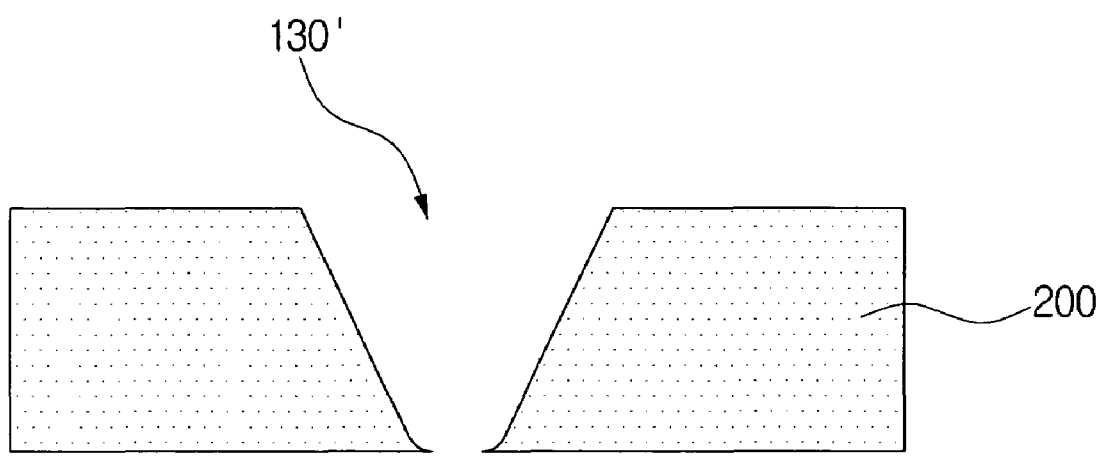

Referring to FIG. 3E, the polysilicon layer 110 is eliminated to complete the formation of the via hole 130' through the glass wafer 200.

In the process described above, after the preliminary via hole 130 having a bottom adjacent to the polysilicon layer 110 has been formed by sandblasting, as shown in FIG. 3C, the preliminary via hole 130 still has a rough surface. However, since the preliminary via hole 130 is not a through hole extending through the glass wafer 200, the preliminary via hole 130 has no undercut portion, which is usually formed at a lower end thereof due to the characteristic of the glass. Thereafter, the preliminary via hole 130 is subjected to the second etching, which is preferably a wet etching utilizing the hydrofluoric acid (HF) solution. Then, the hydrofluoric acid (HF) solution chemically reacts with the rough glass surface of the preliminary via hole 130 formed by the sandblasting, thereby smoothing the rough surface. As a result, a via hole 130' having smooth surfaces and extending through the glass wafer, without an undercut portion formed at the lower end thereof, is completely formed.

Figure 2A:
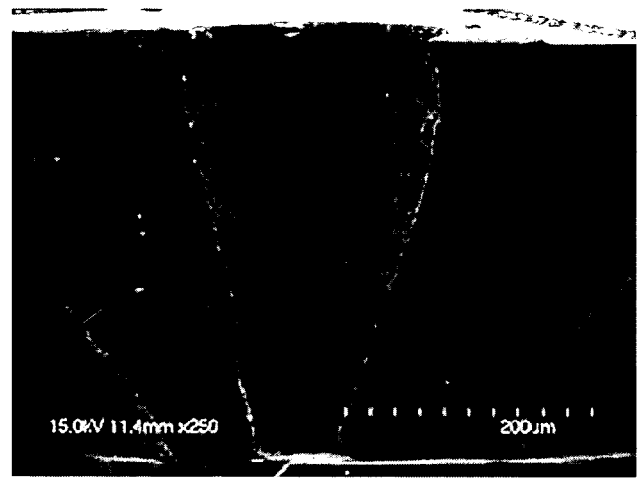
FIGS. 2A and 2B are photographs showing enlarged views of a via hole, which is formed in an actual glass wafer using a conventional process, and an undercut portion formed at a lower end of the via hole, respectively.
Figure 2B:
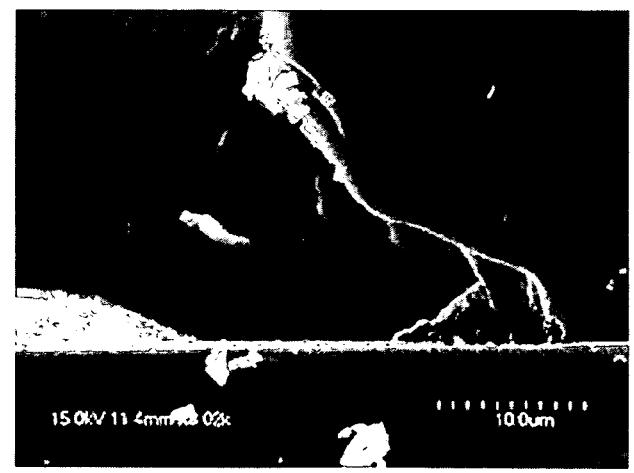
Figure 4A:
FIGS. 4A and 4B are photographs showing enlarged views of a via hole, which is formed in an actual glass wafer by a method according to an embodiment of the present invention, and a lower end of the via hole, respectively.
Figure 4B:
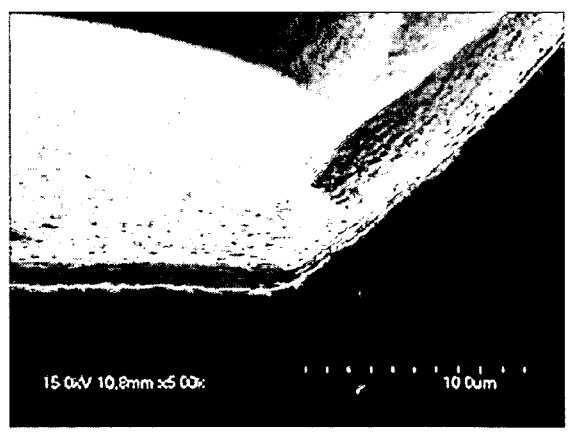

FIGS. 4A and 4B are photographs showing enlarged views of a via hole, which is formed in an actual glass wafer by a method according to an embodiment of the present invention, and a lower end of the via hole, respectively. As shown in FIG. 4A, the via hole formed through the glass wafer by a method according to the present invention has a surface which is much smoother than the surface of the via hole shown in FIG. 2A formed by the conventional method. Further, a lower end of the via hole shown in FIG. 4B has no undercut portion.

The method of forming a via hole through a glass wafer according to the present invention as described above is able to overcome problems of the prior art, such as cut-off, which may be caused by the undercut portion formed during the formation of the via hole, thereby increasing a yield of MEMS elements.

Further, since the present invention employs a wet etching process that is capable of preventing the formation of minute cracks, the present invention improves reliability of the MEMS elements.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a via hole through a glass wafer, comprising:

depositing a first material layer on front and rear surfaces of the glass wafer;

depositing a second material layer on the first material layer;

forming a via pattern in the second material layer;

performing a first etching using the via pattern to form a hole passing through the first material layer on the front surface of the glass wafer and a preliminary via hole in the glass wafer, wherein the preliminary via hole does not pass completely through the glass wafer;

eliminating the second material layer;

performing a second etching in which the preliminary via hole is etched to form a blind via hole having a smooth surface and extending through the glass wafer but not through the first material layer on the rear surface of the glass wafer, such that the first material layer on the rear surface of the glass wafer is exposed through the blind via hole; and eliminating the first material layer, such that the blind via hole is transformed into a through hole.

2. The method as claimed in claim 1, wherein the first material layer is formed of polysilicon.

3. The method as claimed in claim 1, wherein the first etching is performed by sandblasting.

4. The method as claimed in claim 1, wherein the first etching is performed by a device selected from the group consisting of: an ultrasonic wave, a drill, and a laser beam.

5. The method as claimed in claim 1, wherein, during the first etching, the glass wafer is etched to a sufficient depth so that the preliminary via hole has a bottom adjacent to the rear surface of the glass wafer.

6. The method as claimed in claim 1, wherein forming a via pattern in the second material layer further comprises:
   exposing and developing the second material to form the via pattern, wherein the second material is a film resistor.

7. The method as claimed in claim 6, wherein the film resistor comprises a material having a large resistance to sandblast etching to permit the film resistor to function as a protection film during subsequent sandblasting of the glass wafer.

8. The method as claimed in claim 1, wherein the second etching is a wet etching.

9. The method as claimed in claim 8, wherein the wet etching uses a hydrofluoric acid (HF) solution.

10. The method as claimed in claim 1, wherein the first material layer has a selection ratio higher than that of the glass wafer.

* * * * *